United States Patent
Shakutsui et al.

(10) Patent No.: US 10,403,858 B2
(45) Date of Patent: Sep. 3, 2019

(54) METHOD FOR MANUFACTURING ORGANIC ELECTRONIC DEVICE AND METHOD FOR MANUFACTURING SEALING MEMBER

(71) Applicant: SUMITOMO CHEMICAL COMPANY, LIMITED, Tokyo (JP)

(72) Inventors: Masato Shakutsui, Niihama (JP);
Masaya Shimogawara, Niihama (JP);
Shinichi Morishima, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 15/763,559

(22) PCT Filed: Aug. 4, 2016

(86) PCT No.: PCT/JP2016/072939
§ 371 (c)(1),
(2) Date: Mar. 27, 2018

(87) PCT Pub. No.: WO2017/056711
PCT Pub. Date: Apr. 6, 2017

(65) Prior Publication Data
US 2018/0323408 A1 Nov. 8, 2018

(30) Foreign Application Priority Data

Sep. 29, 2015 (JP) .................................. 2015-191883

(51) Int. Cl.
*H01L 51/56* (2006.01)
*H01L 51/50* (2006.01)
(Continued)

(52) U.S. Cl.
CPC .......... *H01L 51/56* (2013.01); *H01L 51/0097* (2013.01); *H01L 51/50* (2013.01);
(Continued)

(58) Field of Classification Search
CPC . H01L 51/56; H01L 51/5259; H01L 51/5246; H01L 51/5206; H01L 51/5221
See application file for complete search history.

(56) References Cited

U.S. PATENT DOCUMENTS

2004/0263075 A1 12/2004 Otsuki et al.
2005/0023960 A1 2/2005 Harada et al.

FOREIGN PATENT DOCUMENTS

CN 1541031 A 10/2004
CN 1575055 A 2/2005
(Continued)

OTHER PUBLICATIONS

International Search Report dated Oct. 25, 2016, issued by the International Searching Authority in application No. PCT/JP2016/072939.
(Continued)

*Primary Examiner* — Anthony Ho
(74) *Attorney, Agent, or Firm* — Sughrue Mion, PLLC

(57) ABSTRACT

According to a method for manufacturing an organic electronic device, a sealing member (19) that includes a sealing substrate (15), an adhesive part (13) exhibiting adhesiveness and is provided on the sealing substrate (15), and a hygroscopic part (11) being a hygroscopic cured product provided on the adhesive part (13) is bonded to an organic electronic element (17).

10 Claims, 11 Drawing Sheets

(51) Int. Cl.
*H05B 33/04* (2006.01)
*H05B 33/10* (2006.01)
*H01L 51/00* (2006.01)
*H01L 51/52* (2006.01)

(52) U.S. Cl.
CPC ...... *H01L 51/5206* (2013.01); *H01L 51/5221* (2013.01); *H01L 51/5246* (2013.01); *H01L 51/5259* (2013.01); *H05B 33/04* (2013.01); *H05B 33/10* (2013.01)

(56) References Cited

FOREIGN PATENT DOCUMENTS

| | | |
|---|---|---|
| JP | 2000-195663 A | 7/2000 |
| JP | 2001-35659 A | 2/2001 |
| JP | 2001-267065 A | 9/2001 |
| JP | 2005-11648 A | 1/2005 |
| JP | 2008-171606 A | 7/2008 |
| JP | 2011-222333 A | 11/2011 |
| JP | 2013-229243 A | 11/2013 |
| JP | 2014-157664 A | 8/2014 |
| WO | 2013/141190 A1 | 9/2013 |

OTHER PUBLICATIONS

International Preliminary Report on Patentability with translation of Written Opinion dated Apr. 12, 2018, issued by the International Searching Authority in application No. PCT/JP2016/072939.

First Office Action dated Jan. 28, 2019, issued by the China National Intellectual Property Administration in Chinese Application No. 201680056057.0.

Extended European Search Report dated Apr. 17, 2019 issued by the European Patent Office in counterpart Application No. 16850888.5.

Notice of Reasons for Rejection dated Jul. 23, 2019 in Japanese Patent Application No. 2015-191883, with translation.

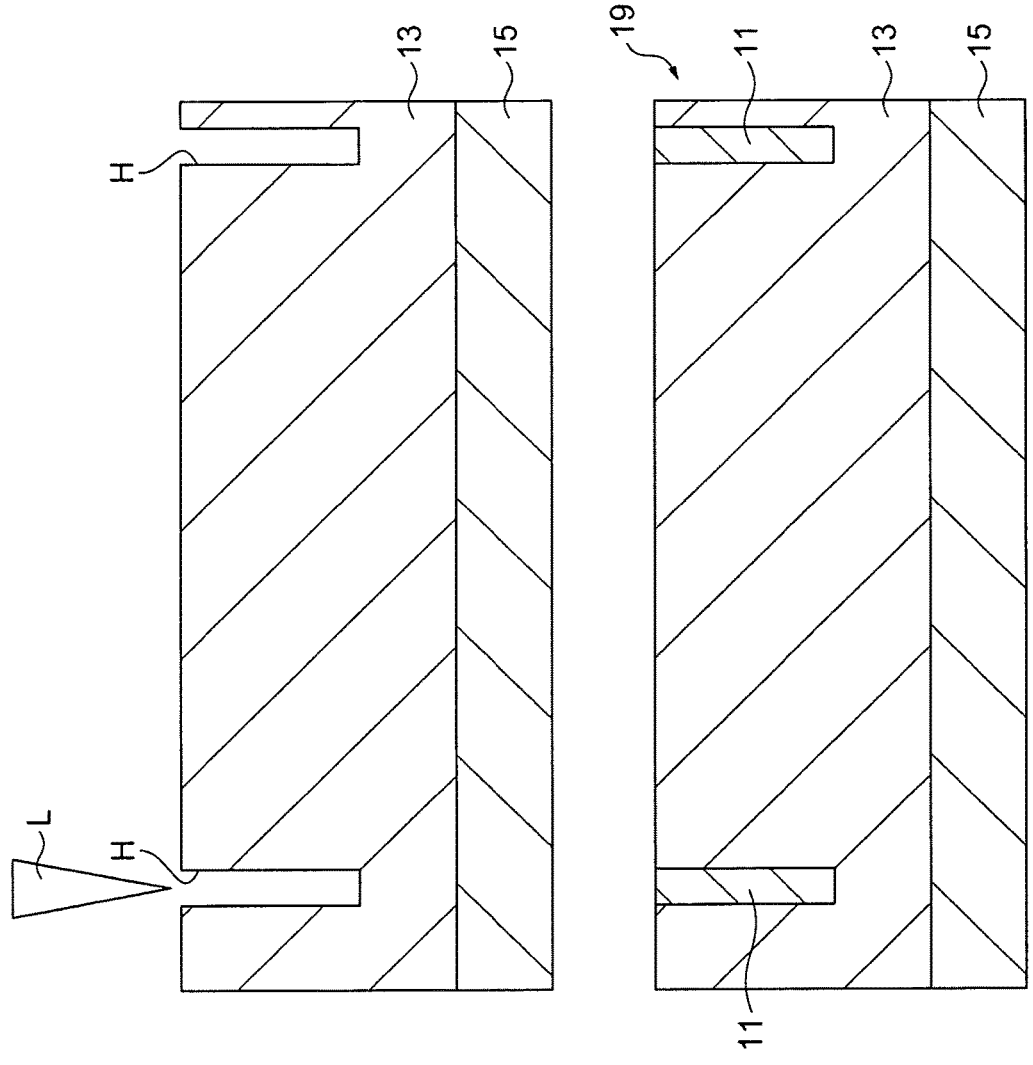

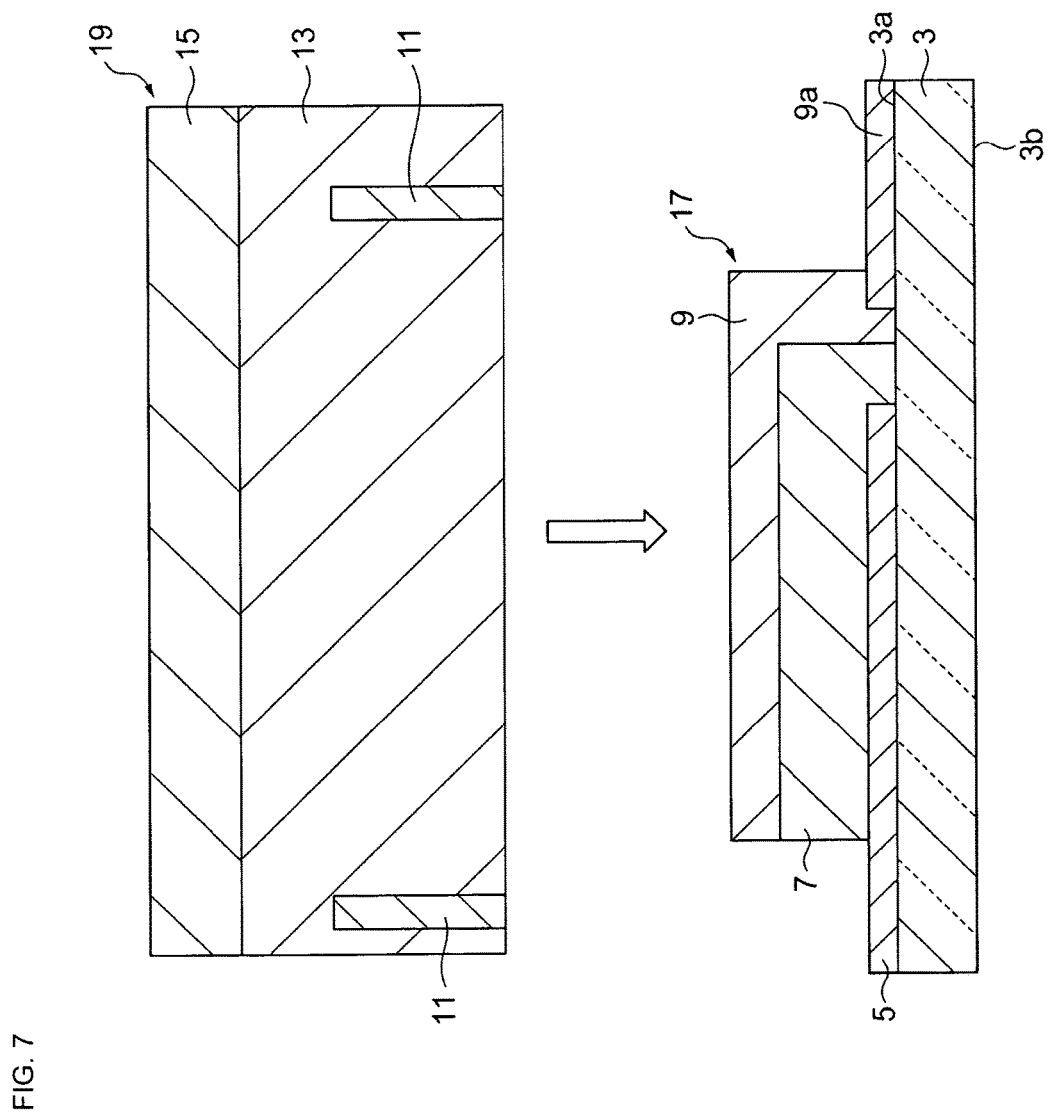

METHOD FOR MANUFACTURING ORGANIC ELECTRONIC DEVICE AND METHOD FOR MANUFACTURING SEALING MEMBER

CROSS REFERENCE TO RELATED APPLICATIONS

This application is a National Stage of International Application No. PCT/JP2016/072939filed Aug. 4, 2016, claiming priority based on Japanese Patent Application No. 2015-191883, filed Sep. 29, 2015, the disclosures of which are incorporated herein by reference.

TECHNICAL FIELD

The present invention relates to a method for manufacturing an organic electronic device and a method for manufacturing a sealing member.

BACKGROUND ART

As a method for manufacturing an organic electronic device in the related art, for example, the method described in Patent Literature 1 is exemplified. The method for manufacturing an organic electronic device described in Patent Literature 1 is a method for manufacturing an electronic device that includes a substrate and an electronic element formed on the substrate. The method includes a step of obtaining a sealing member in which an insulating layer and an adhesive layer are formed on a sealing substrate, a step of forming an insulating layer removal part on the insulating layer and the adhesive layer, a step of filling a resin containing a moisture absorbent into an insulation removal part, a step of bonding the sealing member to the electronic element, and a step of curing the resin by emitting ultraviolet rays while the sealing substrate and the electronic element are bonded together.

CITATION LIST

Patent Literature

[Patent Literature 1] Japanese Patent Application Laid-Open Publication No. 2011-222333

SUMMARY OF INVENTION

Technical Problem

In the above method for manufacturing an organic electronic device in the related art, after the sealing member filled with the resin containing a hygroscopic material and the electronic element are bonded together, the resin is cured by emitting ultraviolet rays. In this case, when the resin is cured, outgassing occurs, and an organic electronic element is exposed to ultraviolet rays. Outgassing and ultraviolet rays can damage the electronic element. Thus, in the method for manufacturing an organic electronic device in the related art, there is a risk of reliability and element performance deteriorating.

An object of an aspect of the present invention is to provide a method for manufacturing an organic electronic device and a method for manufacturing a sealing member through which it is possible to prevent reliability and element performance from deteriorating in a configuration including a hygroscopic part.

Solution to Problem

A method for manufacturing an organic electronic device according to an aspect of the present invention is a method for manufacturing an organic electronic device in which an organic electronic element is formed on a support substrate. The method includes a sealing member forming step of forming a sealing member that includes a sealing substrate, an adhesive part exhibiting adhesiveness and is formed on the sealing substrate, and a hygroscopic part being a hygroscopic cured product formed on the adhesive part; and a sealing step of bonding the sealing member to the organic electronic element.

In the method for manufacturing an organic electronic device according to the aspect of the present invention, the sealing member including the hygroscopic part being a hygroscopic cured product is bonded to the organic electronic element. Therefore, in the manufacturing method, after the sealing member and the organic electronic element are bonded together, it is not necessary to provide a step of curing the hygroscopic part. Accordingly, in the manufacturing method, after the sealing member and the organic electronic element are bonded together, no outgassing occurs. In addition, the organic electronic element on the support substrate is not exposed to ultraviolet rays. Accordingly, outgassing and ultraviolet rays do not damage the organic electronic element. As a result, in the manufacturing method, it is possible to prevent reliability and element performance from deteriorating in a configuration including the hygroscopic part.

In an embodiment, the sealing member forming step may include an adhesive part forming step of forming the adhesive part on the sealing substrate, and a hygroscopic part forming step of forming the hygroscopic part on the adhesive part. When such steps are included, the sealing member can be obtained.

In an embodiment, in the hygroscopic part forming step, the hygroscopic part being a hygroscopic cured product may be adhered to the adhesive part. For example, when the sheet-like hygroscopic part being a hygroscopic cured product is adhered to the adhesive part, it is possible to easily form the hygroscopic part on the adhesive part.

In an embodiment, in the hygroscopic part forming step, a precursor of the hygroscopic part is applied to the adhesive part and cured, so as to form the hygroscopic part. Accordingly, the hygroscopic part being a hygroscopic cured product can be formed on the adhesive part.

In an embodiment, in the hygroscopic part forming step, a recess with a predetermined pattern may be formed in the adhesive part, the recess may be filled with a precursor of the hygroscopic part, and the precursor may be cured, so as to form the hygroscopic part. When the recess is formed according to the shape of the organic electronic element, it is possible for the hygroscopic part to effectively function for the organic electronic element.

In an embodiment, the recess may be formed by emitting a laser beam. Therefore, it is possible to form the recess with high accuracy.

In an embodiment, the recess may be filled with the precursor of the hygroscopic part by a printing method. When the recess may be filled with the precursor by an ink jet printing method, a dispenser method, or the like, the precursor can be filled into the recess with high accuracy.

In an embodiment, before the sealing member is bonded to the organic electronic element, a dehydration treatment may be performed on the sealing member. Thus, the sealing member can be dried. Accordingly, it is possible to prevent the organic electronic element from deteriorating due to moisture contained in the sealing member.

In an embodiment, pressure may be applied to bond the heated sealing member and organic electronic element together. Therefore, since the adhesive part of the sealing member in contact with the organic electronic element is softened, the adhesive part can be brought into close contact with the organic electronic element.

A method for manufacturing a sealing member according to an aspect of the present invention is a method for manufacturing a sealing member that seals an organic electronic element formed on a support substrate. The method includes an adhesive part forming step of forming an adhesive part having an adhesive property on a sealing substrate; and a hygroscopic part forming step of forming a hygroscopic part being a hygroscopic cured product on the adhesive part.

In the method for manufacturing a sealing member according to an aspect of the present invention, the hygroscopic part being a hygroscopic cured product is formed on the adhesive part. When an organic electronic device is manufactured using the sealing member manufactured in this manner, the sealing member including the hygroscopic part being a hygroscopic cured product is bonded to the organic electronic element. Therefore, after the sealing member and the organic electronic element are bonded together, it is not necessary to provide a step of curing the hygroscopic part. Accordingly, in the method for manufacturing an organic electronic device using the sealing member, after the sealing member and the organic electronic element are bonded together, no outgassing occurs. In addition, the organic electronic element on the support substrate is not exposed to ultraviolet rays. Thus, outgassing and ultraviolet rays do not damage the organic electronic element. As a result, it is possible to prevent reliability and element performance from deteriorating in a configuration including the hygroscopic part.

Advantageous Effects of Invention

According to an aspect of the present invention, it is possible to prevent reliability and element performance from deteriorating in a configuration including a hygroscopic part.

BRIEF DESCRIPTION OF DRAWINGS

FIG. 6(A) and FIG. 6(B) is a diagram showing a step of manufacturing a sealing member.

FIG. 7 is a diagram showing a sealing step.

DESCRIPTION OF EMBODIMENTS

Figure 1:
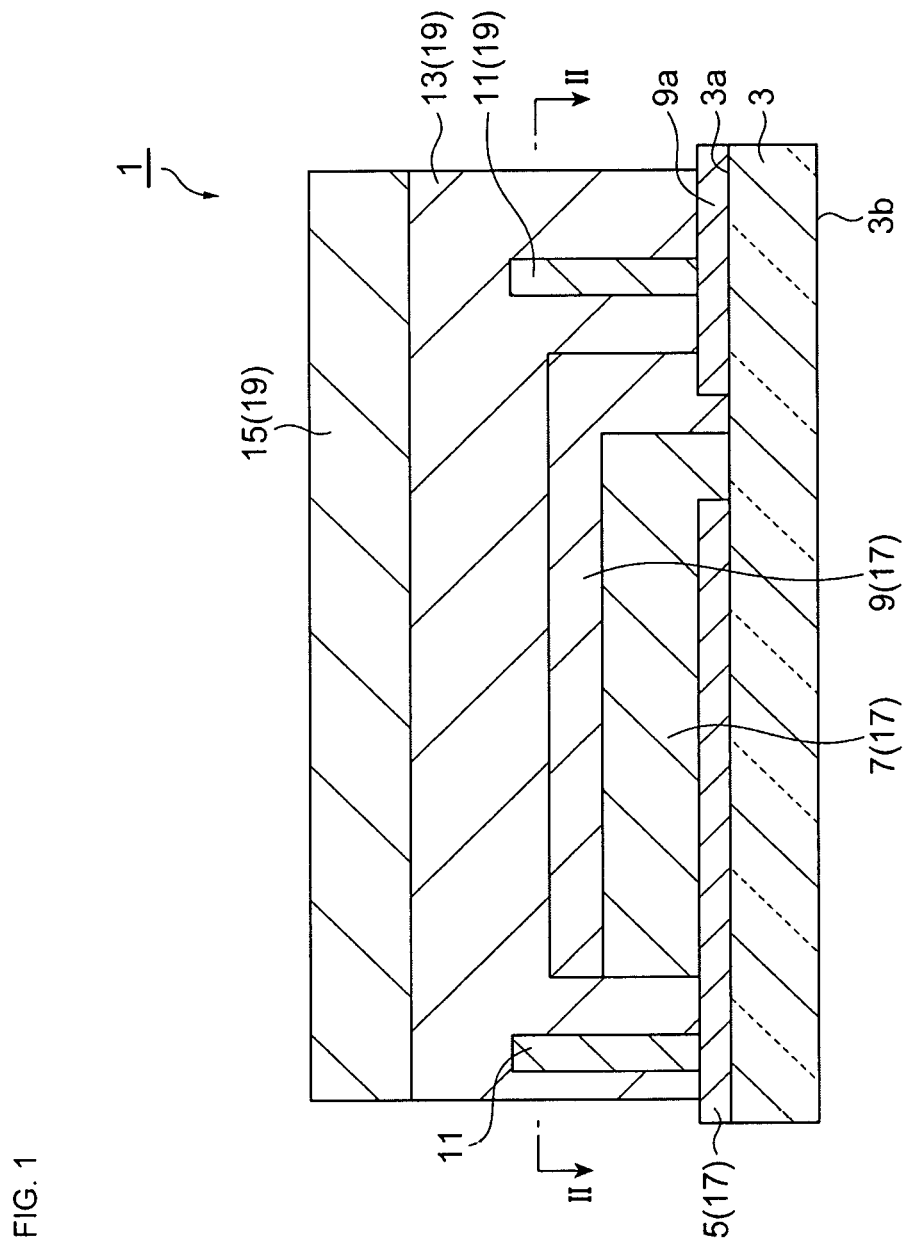
FIG. 1 is a cross-sectional view of an organic EL element manufactured by a method for manufacturing an organic electronic device according to an embodiment.

Exemplary embodiments of the present invention will be described below in detail with reference to the appended drawings. Here, the same or corresponding components are denoted with the same reference numerals in the following description, and redundant descriptions thereof will be omitted.

As shown in FIG. 1, an organic EL element (organic electronic device) 1 manufactured by a method for manufacturing an organic EL element according to the present embodiment includes a support substrate 3, an anode layer 5, a light emitting layer (organic function layer) 7, a cathode layer 9, a hygroscopic part 11, an adhesive part 13, and a sealing substrate 15. The anode layer 5, the light emitting layer 7, and the cathode layer 9 constitute an organic EL part (organic electronic element) 17. The hygroscopic part 11, the adhesive part 13, and the sealing substrate 15 constitute a sealing member 19.

[Support Substrate]

The support substrate 3 is made of a resin having transmittance with respect to visible light (light with a wavelength of 400 nm to 800 nm). The support substrate 3 is a film-like substrate (flexible substrate, substrate having flexibility). The thickness of the support substrate 3 is, for example, 30 μm or more and 500 μm or less.

The support substrate 3 is, for example, a plastic film. The material of the support substrate 3 includes, for example, polyethersulfone (PES); a polyester resin such as polyethylene terephthalate (PET), or polyethylene naphthalate (PEN); a polyolefin resin such as polyethylene (PE), polypropylene (PP), or a cyclic polyolefin; a polyamide resin; a polycarbonate resin; a polystyrene resin; a polyvinyl alcohol resin; a saponified product of an ethylene-vinyl acetate copolymer; a polyacrylonitrile resin; an acetal resin; a polyimide resin; or an epoxy resin.

As the material of the support substrate 3, among the above resins, a polyester resin and a polyolefin resin are preferable because they have high heat resistance, low coefficients of linear expansion, and low production costs, and polyethylene terephthalate and polyethylene naphthalate are particularly preferable. In addition, one type of such resins may be used alone or two or more types thereof may be used in combination.

A moisture barrier layer (barrier layer) may be disposed on one main surface 3a of the support substrate 3. The other main surface 3b of the support substrate 3 is a light emitting surface. Here, the support substrate 3 may be a thin film glass.

[Anode Layer]

The anode layer 5 is disposed on one main surface 3a of the support substrate 3. As the anode layer 5, an electrode layer exhibiting optical transparency is used. As an electrode exhibiting optical transparency, thin films of a metal oxide, a metal sulfide and a metal having high electric conductivity can be used, and a thin film having high light transmittance can be suitably used. For example, thin films made of indium oxide, zinc oxide, tin oxide, indium tin oxide (abbreviation ITO), indium zinc oxide (abbreviation IZO), gold, platinum, silver, and copper are used. Among them, thin films made of ITO, IZO, and tin oxide are suitably used.

As the anode layer 5, a transparent conductive film of an organic substance such as polyaniline and derivatives thereof, or polythiophene and derivatives thereof may be used.

The thickness of the anode layer 5 can be determined in consideration of optical transparency, electric conductivity, and the like. The thickness of the anode layer 5 is generally 10 nm to 10 µm, preferably 20 nm to 1 µm, and more preferably 50 nm to 500 nm.

Examples of a method for forming the anode layer 5 include a vacuum deposition method, a sputtering method, an ion plating method, a plating method, and a coating method.

[Light Emitting Layer]

The light emitting layer 7 is disposed on one main surface 3a of the anode layer 5 and the support substrate 3. Generally, the light emitting layer 7 includes an organic substance that mainly emits fluorescence and/or phosphorescence or the organic substance and a dopant material for a light emitting layer that supports the organic substance. For example, the dopant material for a light emitting layer is added in order to improve luminous efficiency or change a light emitting wavelength. Here, the organic substance may be a low molecular weight compound or a polymer compound. Examples of the light emitting material constituting the light emitting layer 7 include the following dye material, metal complex material, polymer material, and dopant material for a light emitting layer.

(Dye Material)

Examples of the dye material include cyclopendamine and derivatives thereof, tetraphenyl butadiene and derivatives thereof, triphenylamine and derivatives thereof, oxadiazole and derivatives thereof, pyrazoloquinoline and derivatives thereof, distyrylbenzene and derivatives thereof, distyrylarylene and derivatives thereof, pyrrole and derivatives thereof, a thiophene compound, a pyridine compound, perinone and derivatives thereof, perylene and derivatives thereof, oligothiophene and derivatives thereof, an oxadiazole dimer, a pyrazoline dimer, quinacridone and derivatives thereof, and coumarin and derivatives thereof.

(Metal Complex Material)

Examples of the metal complex material include a metal complex including a rare earth metal such as Tb, Eu, or Dy, or Al, Zn, Be, Pt, Ir, or the like as a central metal, and an oxadiazole, thiadiazole, phenylpyridine, phenylbenzoimidazole, or quinoline structure as a ligand. Examples of the metal complex include a metal complex having luminescence from a triplet excited state such as an iridium complex and a platinum complex, an aluminum quinolinol complex, a benzoquinolinol beryllium complex, a benzoxazolyl zinc complex, a benzothiazole zinc complex, an azomethyl zinc complex, a porphyrin zinc complex, a phenanthroline europium complex, and the like.

(Polymer Material)

Examples of the polymer material include polyparaphenylene vinylene and derivatives thereof, polythiophene and derivatives thereof, polyparaphenylene and derivatives thereof, polysilane and derivatives thereof, polyacetylene and derivatives thereof, polyfluorene and derivatives thereof, polyvinylcarbazole and derivatives thereof, the above dye material, and a material obtained by polymerizing a metal complex material.

(Dopant Material for a Light Emitting Layer)

Examples of the dopant material for a light emitting layer include perylene and derivatives thereof, coumarin and derivatives thereof, rubrene and derivatives thereof, quinacridone and derivatives thereof, squalium and derivatives thereof, porphyrin and derivatives thereof, styryl dye, tetracene and derivatives thereof, pyrazolone and derivatives thereof, decacyclene and derivatives thereof, and phenoxazone and derivatives thereof.

The thickness of the light emitting layer 7 is generally about 2 nm to 200 nm. The light emitting layer 7 is formed by, for example, a coating method using a coating solution (for example, an ink) containing the light emitting material described above. A solvent of the coating solution containing a light emitting material is not limited as long as it dissolves the light emitting material.

[Cathode Layer]

The cathode layer 9 is disposed on one main surface 3a of the light emitting layer 7 and the support substrate 3. The cathode layer 9 is electrically connected to an extracting electrode 9a. The extracting electrode 9a is disposed on one main surface 3a of the support substrate 3. The extracting electrode 9a is disposed at a predetermined interval from the anode layer 5. The thickness of the extracting electrode 9a is the same as the thickness of the anode layer 5. The material of the extracting electrode 9a is the same as the material of the anode layer 5.

As the material of the cathode layer 9, for example, an alkali metal, an alkaline earth metal, a transition metal, and a metal in group 13 of the periodic table can be used. As the material of the cathode layer 9, for example, metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, an alloy of two or more of the above metals, an alloy of at least one of the above metals and at least one of gold, silver, platinum, copper, manganese, titanium, cobalt, nickel, tungsten, and tin, graphite or a graphite intercalation compound, and the like are used. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

In addition, as the cathode layer 9, for example, a transparent conductive electrode made of a conductive metal oxide, a conductive organic substance, and the like can be used.

Specifically, examples of the conductive metal oxide include indium oxide, zinc oxide, tin oxide, ITO, and IZO. Examples of the conductive organic substance include polyaniline and derivatives thereof, polythiophene and derivatives thereof, and the like. Here, the cathode layer 9 may be formed by a laminate in which two or more layers are laminated. Here, an electron injection layer may be used as the cathode layer 9.

The thickness of the cathode layer 9 is set in consideration of electric conductivity and durability. The thickness of the cathode layer 9 is generally 10 nm to 10 µm, preferably 20 nm to 1 µm, and more preferably 50 nm to 500 nm.

Examples of a method for forming the cathode layer 9 include a vacuum deposition method, a sputtering method, a lamination method and coating method for thermocompression bonding of a metal thin film, and the like.

[Hygroscopic Part]

Figure 2:
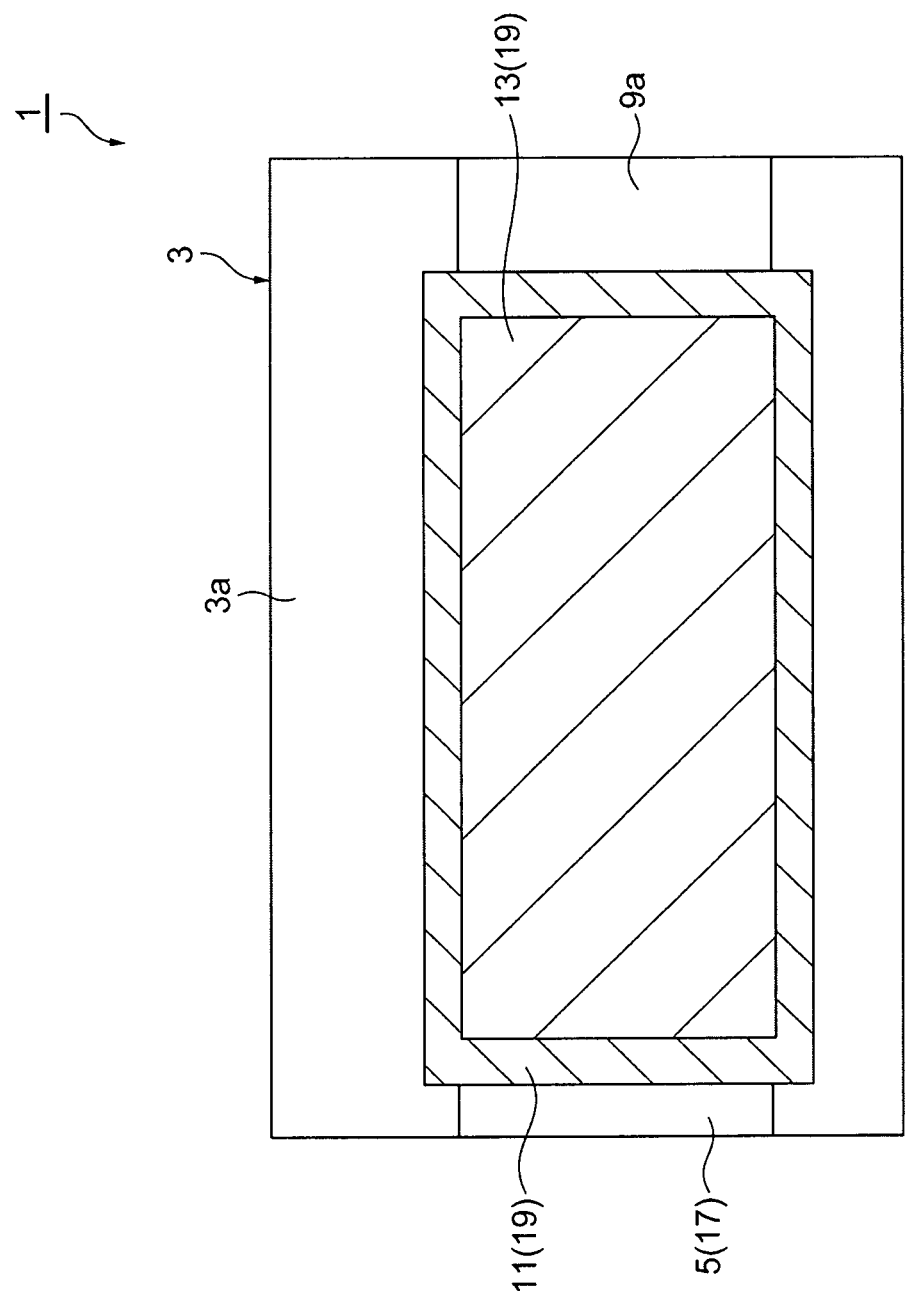
FIG. 2 is a cross-sectional view taken along the line II-II in FIG. 1.

The hygroscopic part 11 is a drying material for capturing moisture. The hygroscopic part 11 may capture oxygen and the like in addition to moisture. The hygroscopic part 11 is disposed on the anode layer 5 and the cathode layer 9. As shown in FIG. 2, the hygroscopic part 11 is disposed to surround the organic EL part 17. The thickness of the hygroscopic part 11 is smaller than the thickness of the adhesive part 13. Here, in FIG. 2, the adhesive part 13 provided outside the hygroscopic part 11 is not shown. In addition, while a form in which the hygroscopic part 11 is continuously formed is shown as an example in FIG. 2, the hygroscopic part 11 may be intermittently formed at predetermined intervals. In short, the hygroscopic part 11 may be formed around the organic EL part 17.

The hygroscopic part 11 is formed by curing a liquid getter material being a precursor of the hygroscopic part 11. The liquid getter material includes a crosslinking compound (curing component) having a photoreactive group. A liquid getter material is applied to the adhesive part 13, an ultraviolet ray (UV) emission treatment is performed after the coating is formed, and the liquid getter material is cured so that the hygroscopic part 11 is formed. In addition, the liquid getter material may include a crosslinking compound having a thermally reactive group. In this case, the liquid getter material is cured by a heating treatment.

The hygroscopic part 11 preferably includes at least one of an organometallic compound, a metal oxide, and a porous material such as zeolite as the liquid getter material. In addition, preferably, a metal constituting the organometallic compound and the metal oxide includes at least one of aluminum, calcium, and barium. In particular, the organo-aluminum compound, the calcium oxide, and the like are more preferable because they have a high moisture refilling rate.

In addition, the hygroscopic part 11 may include a binder, and include particularly at least one of an acrylic resin, an epoxy resin, a styrene resin, an olefin resin and an amide resin.

The shape of the hygroscopic part 11 may be a sheet. In this case, the hygroscopic part 11 is formed by curing a sheet getter material being a precursor of the hygroscopic part 11. The sheet getter material is adhered to the adhesive part 13. The sheet getter material may be a hygroscopic cured product, and after it is applied to the adhesive part 13, it may be cured by a heating treatment or an UV emission treatment.

A hygroscopic rate of the hygroscopic part 11 is preferably 1 wt %/h or more under an RH environment of a temperature of 24° C. and a humidity of 55%.

[Adhesive Part]

The adhesive part 13 is used to adhere the sealing substrate 15 to the anode layer 5, the light emitting layer 7, and the cathode layer 9 (the organic EL part 17). The adhesive part 13 is disposed to cover the organic EL part 17.

Specifically, the adhesive part 13 is made of a photocurable or thermosetting acrylate resin, or a photocurable or thermosetting epoxy resin. Other resin films that are fusible by an impulse sealer commonly used, a thermofusible film, for example, an ethylene vinyl acetate copolymer (EVA), a polypropylene (PP) film, a polyethylene (PE) film, and a polybutadiene (PB) film, can be used. In addition, a thermoplastic resin can be used.

As an adhesive material used in the adhesive part 13, an adhesive material that has high adhesiveness between the organic EL part 17 and the adhesive part 13 and has a strong effect of preventing a significant adhesive heat shrinkage and separation of the organic EL part 17 due to stress on the organic EL part 17, generation of a component having an adverse effect on the organic EL part 17 from the adhesive part 13, and generation and growth of a dark spot having a high barrier ability is preferable.

The thickness of the adhesive part 13 is preferably 1 μm to 100 μm, more preferably 5 μm to 60 μm, and most preferably 10 μm to 30 μm. When the thickness is extremely small, it is not possible to sufficiently embed irregularities or mixed dust into a front surface of the organic EL part 17, which applies mechanical stress on an organic EL material and easily causes a dark spot. On the other hand, when the thickness is extremely large, it is easily influenced by moisture that enters from an end surface of the adhesive part 13. However, when an amount of the adhesive applied is too large, tunneling, effusion, fine wrinkles, and the like may occur. A moisture content contained in the adhesive part 13 is preferably 300 ppm or less (weight basis).

Examples of a method for forming the adhesive part 13 include a hot melt lamination method. The hot melt lamination method is a method in which a hot melt adhesive is melted and an adhesive layer is provided on a support, and the thickness of the adhesive layer can be set to be generally within a wide range of 1 μm to 50 μm. As a base resin of the adhesive that is generally used in the hot melt lamination method, EVA, an ethylene ethyl acrylate copolymer (EEA), polyethylene, butyl rubber, or the like is used. Rosin, a xylene resin, a terpene resin, a styrene resin, or the like is added as a tackifier, and a wax or the like is added as a plasticizer.

In addition, examples of a method for forming the adhesive part 13 include an extrusion lamination method. The extrusion lamination method is a method in which a resin melted at a high temperature is applied to a support by a dice, and the thickness of the adhesive layer can be set to be generally within a wide range of 10 μm to 50 μm. As a resin that is used in the extrusion lamination method, generally low density polyethylene (LDPE), EVA, PP, or the like is used.

[Sealing Member]

The sealing substrate 15 is disposed on the uppermost part (on the adhesive part 13) of the organic EL element 1. The sealing substrate 15 is made of a metal foil, a barrier film in which a barrier function layer is formed on a front surface, a back surface, or both surfaces of a transparent plastic film, a thin film glass having a flexible property, or a metal laminate film having a barrier ability on a plastic film, and has a gas barrier function, and particularly, a moisture barrier function. As the metal foil, copper, aluminum, and stainless steel are preferable in consideration of a barrier ability. A larger thickness of the metal foil is preferable in order to prevent a pinhole, and the thickness is preferably 15 μm to 50 μm in consideration of flexibility.

[Method for Manufacturing Organic EL Element]

Subsequently, a method for manufacturing the organic EL element 1 having the above configuration will be described.

When the organic EL element 1 is manufactured, first, the support substrate 3 is heated and dried (substrate drying step S01). Then, the organic EL part 17 is formed on the dried support substrate 3. For the organic EL part 17, a step of forming the anode layer 5 on the dried support substrate 3 (anode layer forming step S02), a step of forming the light emitting layer 7 on the anode layer 5 (light emitting layer forming step S03), and a step of forming the cathode layer 9 on the light emitting layer 7 (cathode layer forming step S04) are performed in that order. When the organic EL part 17 is formed, the layers may be formed by a formation method exemplified in the description of the layers.

After the organic EL part 17 is formed, a step of bonding the organic EL part 17 and the sealing member 19 together and sealing the organic EL part 17 using the sealing member 19 (sealing step S05) is performed.

Figure 3:
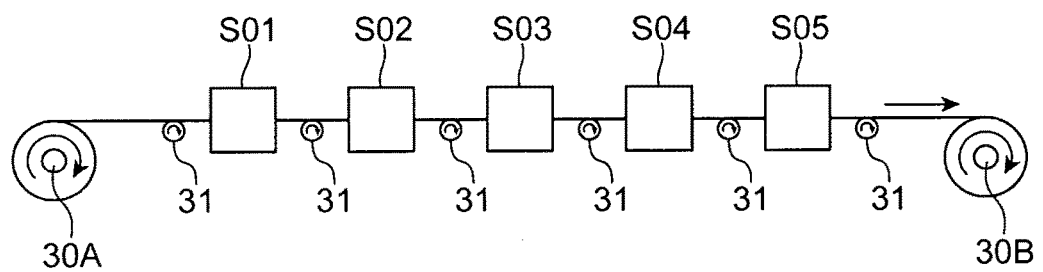
FIG. 3 is a diagram schematically showing a method for manufacturing an organic EL element by a roll-to-roll process.

In a form in which the support substrate 3 is a flexible substrate, as conceptually shown in FIG. 3, a roll-to-roll process can be used. When the organic EL element 1 is manufactured by the roll-to-roll process, while the stretched long elongated flexible support substrate 3 is continuously conveyed between an unwinding roller 30A and a winding roller 30B by a conveying roller 31, the support substrate 3 may be dried and the layers constituting the organic EL part 17 may be formed in order from the side of the support substrate 3.

Figure 4:
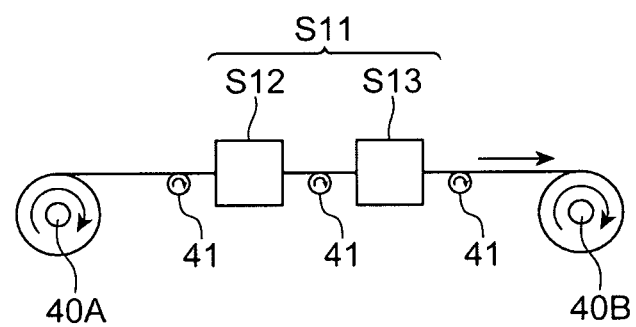
FIG. 4 is a diagram schematically showing a method for manufacturing a sealing member by a roll-to-roll process.

Subsequently, a method for forming the sealing member 19 to be bonded to the organic EL part 17 (sealing member forming step S11) will be described. In a form in which the sealing substrate 15 is a flexible substrate, as conceptually shown in FIG. 4, the roll-to-roll process can be used. When the sealing member 19 is manufactured by the roll-to-roll process, while the stretched long elongated flexible sealing substrate 15 is continuously conveyed between an unwinding roller 40A and a winding roller 40B by a conveying roller 41, the hygroscopic part 11 and the adhesive part 13 constituting the sealing member 19 may be formed in order from the side of the sealing substrate 15.

Figure 5A:
FIG. 5(A) and FIG. 5(B) is a diagram showing a step of manufacturing a sealing member.
Figure 5B:
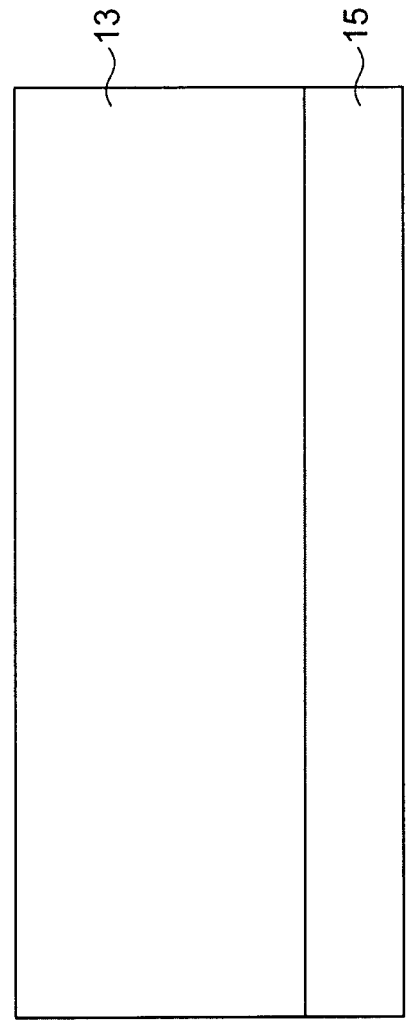

First, on one surface of the sealing substrate 15 shown in FIG. 5(A), as shown in FIG. 5(B), the adhesive part 13 is formed (adhesive part forming step S12). The adhesive part 13 may be formed by a formation method exemplified when the adhesive part 13 is described. In addition, the adhesive part 13 formed into a sheet shape in advance may be bonded to the sealing substrate 15.

Subsequently, as shown in FIG. 6(A), a recess H with a predetermined pattern is formed in the adhesive part 13. In the present embodiment, the recess H is formed by emitting a laser beam L and removing the adhesive part 13. In the present embodiment, as shown in FIG. 2, the recess H is formed into a frame shape so that the hygroscopic part 11 surrounds the organic EL part 17. Here, formation of the recess H is not limited to use of emission of the laser beam L. The recess H may be formed by a photolithography method, a printing method (for example, nanoimprint), or the like.

Next, a getter material is filled (applied) into the recess H. Examples of a method for filling a getter material into the recess H include a printing method such as an ink jet printing method and a dispenser method. Subsequently, when an UV emission treatment is performed on the getter material filled into the recess H, the getter material is cured. Thereby, as shown in FIG. 6(B), the hygroscopic part 11 is formed in the recess H (hygroscopic part forming step S13). Thereby, the sealing member 19 is manufactured. When the getter material is filled (applied) and cured, it is preferably performed in an environment with a low moisture concentration, and particularly preferably performed in a nitrogen atmosphere.

In addition, the hygroscopic part 11 that is cured may be formed on the adhesive part 13. For example, a sheet member being a hygroscopic cured product may be adhered to the adhesive part 13, so as to form the hygroscopic part 11.

The sealing member 19 formed as described above is subjected to a dehydration treatment before it is bonded to the organic EL part 17 formed on the support substrate 3. In the dehydration treatment, the sealing member 19 is heated. As a device for heating the sealing member 19, a device for emitting infrared rays to the sealing member 19, a device for supplying hot air, a heating roller in contact with the sealing member 19, an oven, and the like can be used. A dehydration treatment of the sealing member 19 is preferably performed in an environment with a low moisture concentration, and particularly preferably performed in a nitrogen atmosphere.

Figure 8:
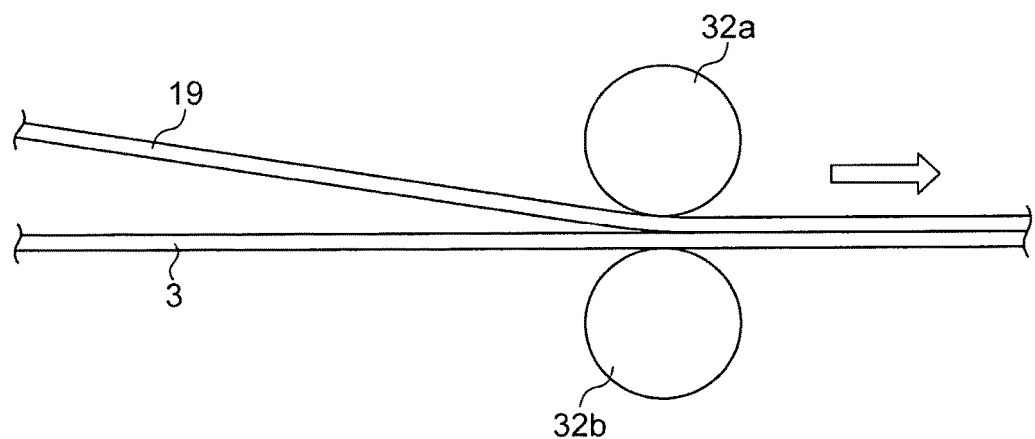
FIG. 8 is a diagram showing a sealing step by a roll-to-roll process.

In the sealing step S05, as shown in FIG. 7, the organic EL part 17 and the sealing member 19 are bonded together. In the roll-to-roll process, while the support substrate 3 is conveyed, as shown in FIG. 8, the organic EL part 17 formed on the support substrate 3 and the sealing member 19 are bonded together. The support substrate 3 and the sealing member 19 pass between heating rollers 32a and 32b. Thus, a pressure is applied to the support substrate 3 and the sealing member 19 while they are heated by the heating rollers 32a and 32b. Accordingly, the adhesive part 13 softens and the adhesive part 13 is brought into close contact with the organic EL part 17. When the organic EL part 17 and the sealing member 19 are bonded together, it is preferably performed in an environment with a low moisture concentration, and particularly preferably performed in a nitrogen atmosphere. Accordingly, as shown in FIG. 1, the organic EL element 1 is manufactured.

As described above, in the method for manufacturing the organic EL element 1 according to the present embodiment, the sealing member 19 including the hygroscopic part 11 being a hygroscopic cured product is bonded to the organic EL part 17. Therefore, in the manufacturing method, after the sealing member 19 and the organic EL part 17 are bonded together, a step of curing the hygroscopic part 11 is not necessary. Therefore, in the manufacturing method, after the sealing member 19 and the organic EL part 17 are bonded together, even if outgassing occurs, the organic EL part 17 is not exposed to ultraviolet rays. Thus, outgassing and ultraviolet rays do not damage the organic EL part 17. As a result, in the manufacturing method, in a configuration including the hygroscopic part 11, it is possible to prevent reliability and element performance from deteriorating.

In addition, in the method for manufacturing the organic EL element 1, since no outgassing occurs after the sealing member 19 including the hygroscopic part 11 being a hygroscopic cured product and the organic EL part 17 are bonded together, it is not necessary to provide a protective layer for preventing deterioration due to outgassing on the organic EL part 17. Thus, it is possible to simplify the configuration of the organic EL element 1. In addition, since a step of forming a protective layer is not necessary, productivity can be improved.

In addition, in the method for manufacturing the organic EL element 1, since the hygroscopic part 11 of the sealing member 19 including the hygroscopic part 11 being a hygroscopic cured product is filled into the recess H and formed, when the sealing member 19 and the organic EL part 17 are bonded together, there is no irregularity on the front surface of the sealing member 19 and the occurrence of bonding defects such as voids can be prevented. In addition, when the sealing member 19 and the organic EL part 17 are bonded together, since it is possible to avoid partial concentration of stress, it is possible to prevent the occurrence of damage in the organic EL part 17, the support substrate 3, and the like.

In the present embodiment, in the hygroscopic part forming step S13, a getter material being a precursor of the hygroscopic part 11 is applied to the adhesive part 13 and cured, so as to form the hygroscopic part 11. Thereby, it is possible to favorably form the hygroscopic part 11 being a hygroscopic cured product on the adhesive part 13.

In the present embodiment, in the hygroscopic part forming step, the recess H with a predetermined pattern is formed in the adhesive part 13, a getter material being a precursor of the hygroscopic part 11 is filled into the recess H, the getter material is cured, so as to form the hygroscopic part 11. When the recess H is formed according to the shape of the organic EL part 17, it is possible for the hygroscopic part 11 to effectively function for the organic EL part 17.

In the present embodiment, before the sealing member 19 is bonded to the organic EL part 17, a dehydration treatment is performed on the sealing member 19. Thus, the sealing member 19 can be dried. Accordingly, it is possible to prevent the organic EL part 17 from deteriorating due to moisture contained in the sealing member 19.

In the present embodiment, the sealing member 19 and the organic EL part 17 heated by the heating rollers 32a and 32b are bonded together with a pressure applied. Therefore, since the adhesive part 13 of the sealing member 19 in contact with the organic EL part 17 is softened, the adhesive part 13 can be brought into close contact with the organic EL part 17.

Here, the present invention is not limited to the above present embodiment, and various modifications can be possible. For example, in the above embodiment, the organic EL element 1 in which the light emitting layer 7 is disposed between the anode layer 5 and the cathode layer 9 is exemplified. However, the configuration of the organic function layer is not limited thereto. The organic function layer may have the following configuration.

(a) Anode layer/light emitting layer/cathode layer (b) Anode layer/hole injection layer/light emitting layer/cathode layer (c) Anode layer/hole injection layer/light emitting layer/electron injection layer/cathode layer (d) Anode layer/hole injection layer/light emitting layer/electron transport layer/electron injection layer/cathode layer (e) Anode layer/hole injection layer/hole transport layer/light emitting layer/cathode layer (f) Anode layer/hole injection layer/hole transport layer/light emitting layer/electron injection layer/cathode layer (g) Anode layer/hole injection layer/hole transport layer/light emitting layer/electron transport layer/electron injection layer/cathode layer (h) Anode layer/light emitting layer/electron injection layer/cathode layer (i) Anode layer/light emitting layer/electron transport layer/electron injection layer/cathode layer Here, the symbol "/" indicates that layers with the symbol "/" therebetween are laminated adjacently. The configuration shown in the above (a) is a configuration of the organic EL element 1 in the above embodiment.

As materials of a hole injection layer, a hole transport layer, an electron transport layer, and an electron injection layer, known materials can be used. The hole injection layer, the hole transport layer, the electron transport layer, and the electron injection layer can be formed by, for example, a coating method, as in the light emitting layer 7.

The organic EL element 1 may include a single light emitting layer 7 or two or more light emitting layers 7. In any one of the above (a) to (i) layer structures, when a lamination structure disposed between the anode layer 5 and the cathode layer 9 is set as a "structural unit A," as a configuration of an organic EL element including the two or more light emitting layers 7, for example, a layer structure shown in the following (j), can be exemplified. Two layer structures (structural unit A) may be the same or different from each other.

(j) Anode layer/(structural unit A)/charge generation layer/(structural unit A)/cathode layer Here, the charge generation layer is a layer that generates a hole and an electron when an electric field is applied. Examples of the charge generation layer include a thin film made of vanadium oxide, ITO, molybdenum oxide, or the like.

In addition, when "(structural unit A)/charge generation layer" is set as a "structural unit B," as a configuration of an organic EL element including three or more light emitting layers, for example, a layer structure shown in the following (k) can be exemplified.

(k) Anode layer/(structural unit B) x/(structural unit A)/cathode layer

The symbol "x" denotes an integer of 2 or more, and "(structural unit B) x" denotes a laminate in which x (structural units B) are laminated. In addition, a plurality of (structural unit B) layer structures may be the same or different from each other.

An organic EL element in which the plurality of light emitting layers 7 are directly laminated without providing the charge generation layer may be formed.

In the above embodiment, a form in which the anode layer 5 is formed on the support substrate 3 by the roll-to-roll process has been described as an example. However, the anode layer 5 is formed on the support substrate 3 in advance, and while the support substrate 3 in which the stretched long elongated anode layer 5 is formed between the unwinding roller 30A and the winding roller 30B is continuously conveyed by the conveying roller 31, steps of manufacturing the organic EL element 1 may be performed.

Figure 9:
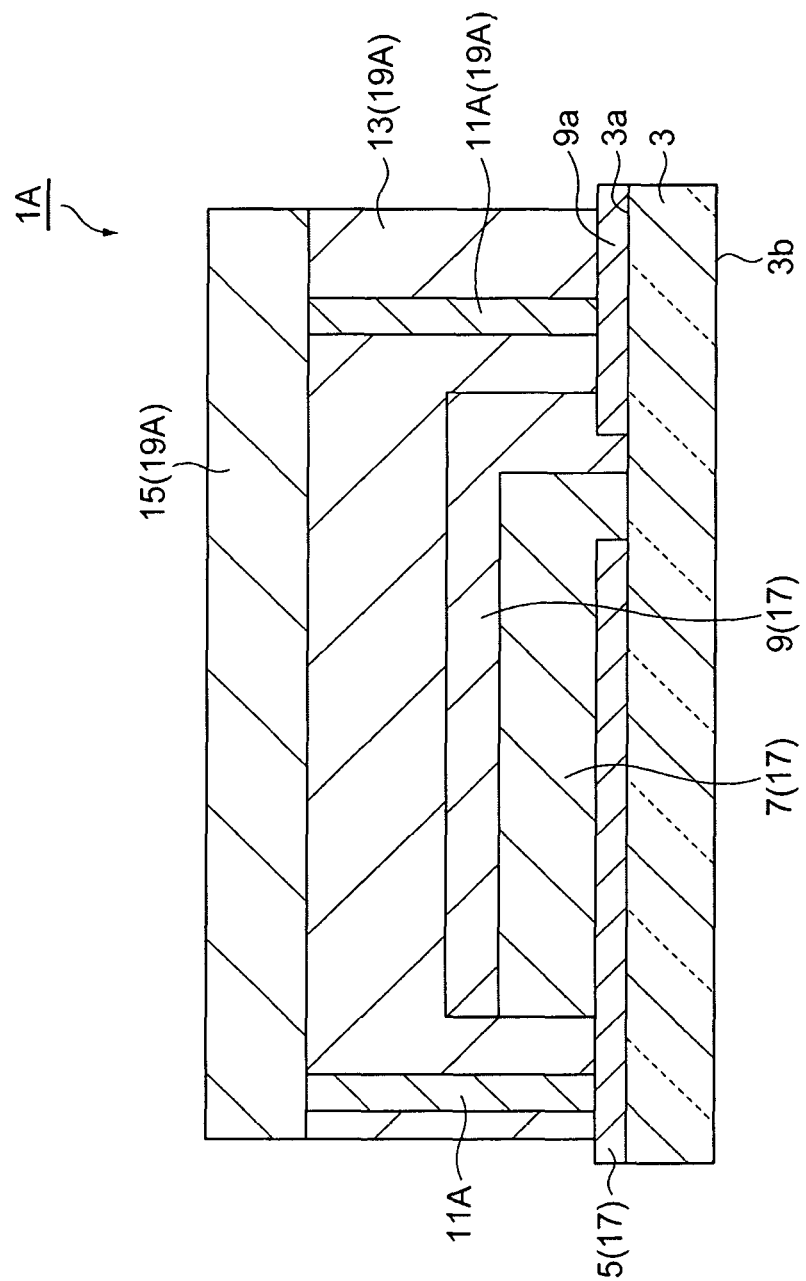
FIG. 9 is a cross-sectional view of an organic EL element according to another embodiment.
Figure 10:
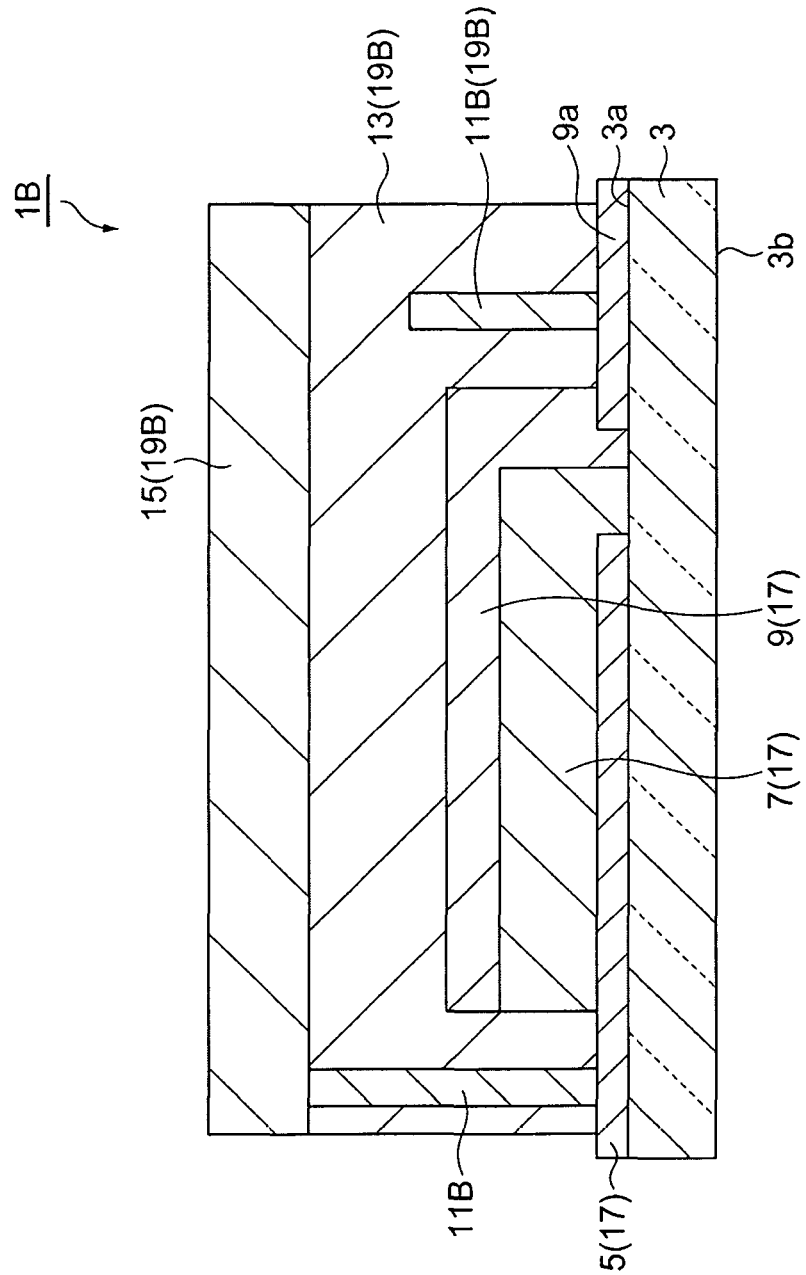
FIG. 10 is a cross-sectional view of an organic EL element according to another embodiment.
Figure 11:
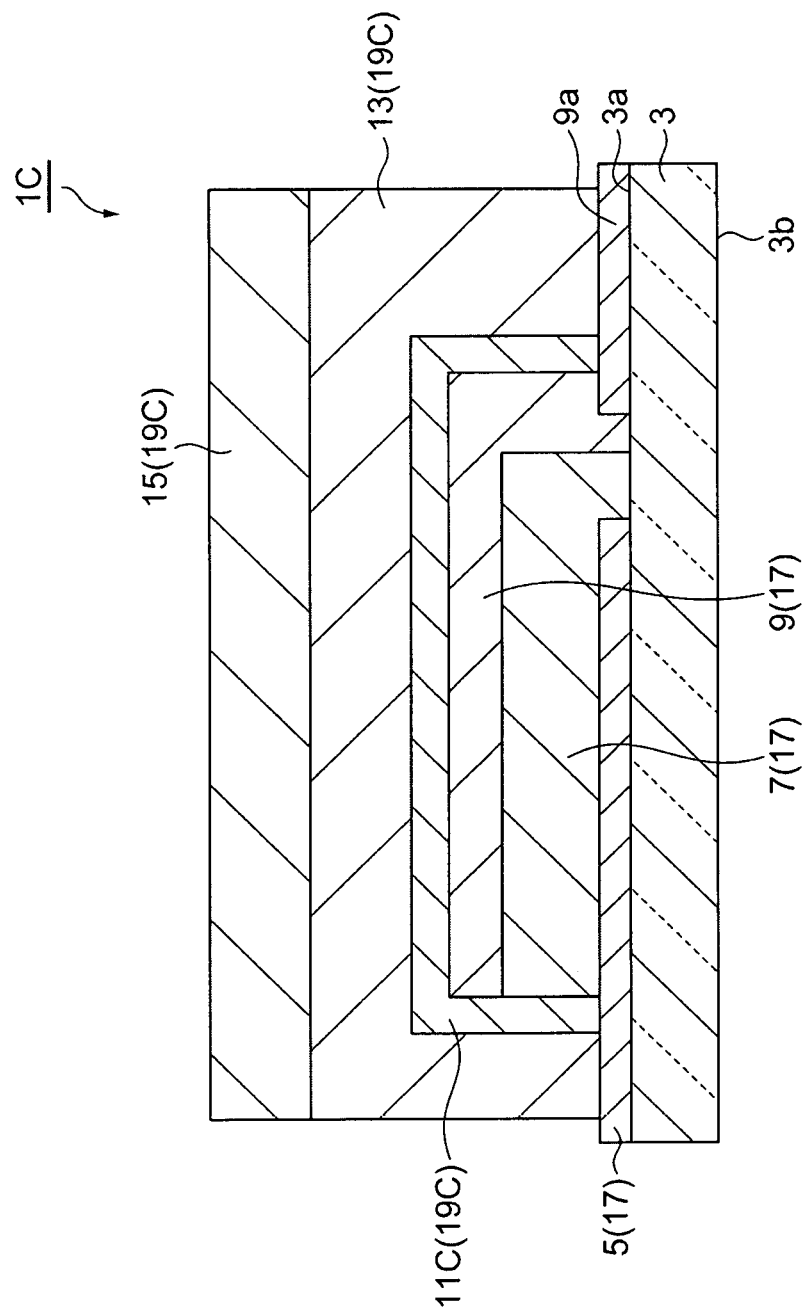
FIG. 11 is a cross-sectional view of an organic EL element according to another embodiment.

The organic EL element may have the configuration shown in FIG. 9 to FIG. 11. As shown in FIG. 9, an organic EL element 1A includes a hygroscopic part 11A. The hygroscopic part 11A constitutes a sealing member 19A. The thickness of the hygroscopic part 11A is the same as the thickness of the adhesive part 13. That is, the upper end of the hygroscopic part 11A is in contact with the sealing substrate 15.

As shown in FIG. 10, an organic EL element 1B includes a hygroscopic part 11B. The hygroscopic part 11B constitutes a sealing member 19B. The thickness of the hygroscopic part 11B is not constant. Specifically, the thickness of a part (the right side in FIG. 10) of the hygroscopic part 11B is smaller than the thickness of the adhesive part 13, and the thickness of a part (the left side in FIG. 10) of the hygroscopic part 11B is the same as the thickness of the adhesive part 13.

As shown in FIG. 11, an organic EL element 1C includes a hygroscopic part 11C. The hygroscopic part 11A constitutes a sealing member 19C. The hygroscopic part 11C covers the cathode layer 9. All of the organic EL elements 1A, 1B, and 1C shown in FIG. 9 to FIG. 11 can be manufactured by the above manufacturing method.

In the above embodiment, the organic EL element has been exemplified as an organic EL device. The organic EL device may be an organic thin film transistor, an organic photodetector, an organic thin film solar cell, or the like.

Various embodiments of the present invention have been described above. However, the present invention is not limited to the above various embodiments, and various modifications can be made within a range without departing from the spirit and scope of the present invention.

REFERENCE SIGNS LIST

1 Organic EL element (organic electronic device)
3 Support substrate
11 Hygroscopic part
13 Adhesive part
15 Sealing substrate
17 Organic EL part (organic electronic element)
19 Sealing member
H Recess S05 Sealing step
S11 Sealing member forming step
S12 Adhesive part forming step
S13 Hygroscopic part forming step

The invention claimed is:

1. A method for manufacturing an organic electronic device in which an organic electronic element is formed on a support substrate, the method comprising:
   a sealing member forming step of forming a sealing member that includes a sealing substrate, an adhesive part exhibiting adhesiveness, formed on the sealing substrate, and to be adhered to the organic electronic element, and a hygroscopic part being a hygroscopic cured product formed on the adhesive part and to be disposed around the organic electronic element; and
   a sealing step of bonding the sealing member to the organic electronic element,
   wherein in the sealing step, the adhesive part is adhered to the organic electronic element and the sealing member is bonded to the organic electronic element such that the hygroscopic part is disposed around the organic electronic element viewed at right angles to the support substrate.

2. The method for manufacturing an organic electronic device according to claim 1,
   wherein the sealing member forming step includes
   an adhesive part forming step of forming the adhesive part on the sealing substrate, and
   a hygroscopic part forming step of forming the hygroscopic part on the adhesive part.

3. The method for manufacturing an organic electronic device according to claim 2,
   wherein, in the hygroscopic part forming step, the hygroscopic part being the hygroscopic cured product is adhered to the adhesive part.

4. The method for manufacturing an organic electronic device according to claim 2,
   wherein, in the hygroscopic part forming step, a precursor of the hygroscopic part is applied to the adhesive part and cured, so as to from the hygroscopic part.

5. The method for manufacturing an organic electronic device according to claim 2,
   wherein, in the hygroscopic part forming step, a recess with a predetermined pattern is formed in the adhesive part, the recess is filled with a precursor of the hygroscopic part, and the precursor is cured, so as to form the hygroscopic part.

6. The method for manufacturing an organic electronic device according to claim 5,
   wherein the recess is formed by emitting a laser beam.

7. The method for manufacturing an organic electronic device according to claim 5,
   wherein the recess is filled with the precursor of the hygroscopic part by a printing method.

8. The method for manufacturing an organic electronic device according to claim 1,
   wherein, before the sealing member is bonded to the organic electronic element, a dehydration treatment is performed on the sealing member.

9. The method for manufacturing an organic electronic device according to claim 1,
   wherein pressure is applied to bond the heated sealing member and organic electronic element together.

10. A method for manufacturing a sealing member that seals an organic electronic element formed on a support substrate, the method comprising:
   an adhesive part forming step of forming an adhesive part having an adhesive property and to be adhered to the organic electronic element on a sealing substrate; and
   a hygroscopic part forming step of forming, on the adhesive part, a hygroscopic part being a hygroscopic cured product and having a shape surrounding the organic electronic element so as to be disposed around the organic electronic element.

* * * * *